(12) United States Patent
Su

(10) Patent No.: US 9,373,616 B1
(45) Date of Patent: Jun. 21, 2016

(54) ELECTROSTATIC PROTECTIVE DEVICE

(71) Applicant: Qing Su, Shanghai (CN)

(72) Inventor: Qing Su, Shanghai (CN)

(73) Assignee: Shanghai Huahong Grace Semiconductor Manufacturing Corporation, Pudong New Area Shanghai (CN)

( * ) Notice: Subject to any disclaimer, the term of this patent is extended or adjusted under 35 U.S.C. 154(b) by 0 days.

(21) Appl. No.: 14/581,687

(22) Filed: Dec. 23, 2014

(51) Int. Cl.
*H01L 29/78* (2006.01)
*H01L 27/02* (2006.01)
*H01L 29/06* (2006.01)

(52) U.S. Cl.
CPC ........ *H01L 27/0266* (2013.01); *H01L 29/0696* (2013.01); *H01L 29/78* (2013.01)

(58) Field of Classification Search
CPC .................... H01L 27/0248; H01L 27/0266
USPC ......................................... 257/360, 358, 288
See application file for complete search history.

(56) References Cited

U.S. PATENT DOCUMENTS

2013/0113045 A1* 5/2013 Wen et al. ..................... 257/355

* cited by examiner

*Primary Examiner* — Cuong Q Nguyen
*Assistant Examiner* — Tong-Ho Kim
(74) *Attorney, Agent, or Firm* — Lau & Associates

(57) ABSTRACT

The present invention discloses an electrostatic protective device structure, which comprises a CMOS transistor that is disposed entirely above a P-type silicon substrate and arranged into a multi-finger-pattern structure, wherein on the outermost side on both sides of this electrostatic protective device structure is the source region of the MOS transistor, an active region of other drain region or source region in addition to the outermost source region on both sides is arranged in comb teeth pattern and in pairwise intersection, between the active regions of the adjacent drain region or source region is a field oxide region isolation, and on the drain region or source region is disposed a contact hole connecting metal with the active region, wherein the contact hole on the comb-tooth-pattern and pairwise intersected active region is located at the top of the comb-tooth-pattern active region, i.e. close to a side of the field oxide region isolation far away from the polysilicon gate. The present invention, mainly applied to electrostatic protection of a low-voltage MOS, is capable of not only improving its electrostatic protection capability effectively but also minimizing the occupied area of the protective device, and able to be used as both an electrostatic protective device and a power device.

6 Claims, 5 Drawing Sheets

ELECTROSTATIC PROTECTIVE DEVICE

This application claims a foreign priority of Chinese Patent Application No. 201410169533.2 filed on Apr. 25, 2014, which foreign priority of Chinese Patent Application, in its entirety, is incorporated herein by reference.

FIELD OF THE INVENTION

The present invention relates to the field of semiconductor manufacture, especially to an electrostatic protective device.

BACKGROUND OF THE INVENTION

Static electricity is an objective natural phenomenon, and has a variety of ways of production, such as contact, friction, and induction between electrical appliances. Static electricity is characterized by long-term accumulation, high voltage, low electric quantity, small current and short duration of action. Static electricity causes serious harm in a number of fields. Electrification by friction and human body static are two big hazards in the electronics industry, often resulting in unstable operation of electrical and electronic products, and even damage. ESD is an academic subject formed since the mid-20th century for studying generation, harm, protection and the like of static electricity, with the electrostatic protection equipment internationally customarily generally referred to as ESD.

For a product applied to power management, a self-protection solution is used as its electrostatic protection solution because of its large area, as shown in FIG. 1, i.e., the protected circuit itself has certain electrostatic discharge capability, needing no additional electrostatic protection measures. However, an ordinary device without targeted optimized structure has weak self-protection capability. If a traditional electrostatic protection structure is used for a power device, although ESD has enough protection capability, its area may be more than one time greater compared to an ordinary device, which is mainly because the distance L between the metal contact hole of the drain region or source region and the polysilicon gate is much greater compared to the ordinary device, with the size of L directly relating to the electrostatic protection capability of this device, the greater the L, the higher the electrostatic protection capability. For example, L is 0.5 μm for an ordinary device, while 2.5 μm and more for a traditional electrostatic protection structure.

CONTENTS OF THE INVENTION

The technical problem to be solved by the present invention is to provide an electrostatic protective device with improved electrostatic protection capability, without increasing area of the device.

In order to solve above technical problem, the present invention provides an electrostatic protective device, the structure of which comprises a CMOS transistor that is disposed entirely above a P-type silicon substrate and arranged into a multi-finger-like structure, wherein on the outermost side on both sides of this electrostatic protective device is the source region of the MOS transistor, an active region of other drain region or source region in addition to the outermost source region on both sides is arranged in a comb teeth pattern and in pairwise intersection, between the active regions of the adjacent drain region or source region is a field oxide region isolation, on the drain region or source region is disposed a contact hole connecting metal with the active region, wherein the contact hole on the comb-tooth-pattern and pairwise intersected active region is located at the top of the comb-tooth-pattern active region, i.e. close to a side of the field oxide region isolation far away from the polysilicon gate. With an axial direction a defined, the contact holes of the adjacent MOS transistors in addition to those of the outermost source region on both sides are not disposed in the same straight line, a source contact hole of each of the MOS transistors being at a same distance from its respective polysilicon gate, a drain contact hole of each of the MOS transistors being at a same distance from its respective polysilicon gate.

The MOS transistor is of an N type or a P type.

The present invention, based on the existing multi-finger-like structure, forms a comb-tooth-pattern structure by inserting a field oxide region isolation into the active region of the drain region and source region of each of the MOS transistors in addition to the outermost source region on both sides; when static electricity enters this protection structure from the drain electrode, the current path through which it flows is as shown in FIG. 4, with the current flowing out of the metal contact hole of the source region through a channel; in the entire current path, the distance from the polysilicon gate to the drain contact hole and source contact hole is still kept to be L, being the same as in a traditional electrostatic protection structure. The distance from the polysilicon gate to the drain contact hole or source contact hole is not reduced as a result of the reduced area of the drain region and source region, which then guarantees constant electrostatic capability while the occupied area is reduced. Under the premise of ensuring its ESD capability, the area occupied by the device is effectively reduced.

The present invention, mainly applied to electrostatic protection of a low-voltage MOS, is capable of not only improving its electrostatic protection capability effectively but also minimizing the occupied area of the protective device, even capable of being applied to power management products and an application requiring great switching current, and able to be used as both an electrostatic protective device and a power device.

BRIEF DESCRIPTION OF THE DRAWINGS

The present invention will be further described below in detail with reference to drawings and embodiments.

LIST OF REFERENCE NUMBERS

Figure 1:
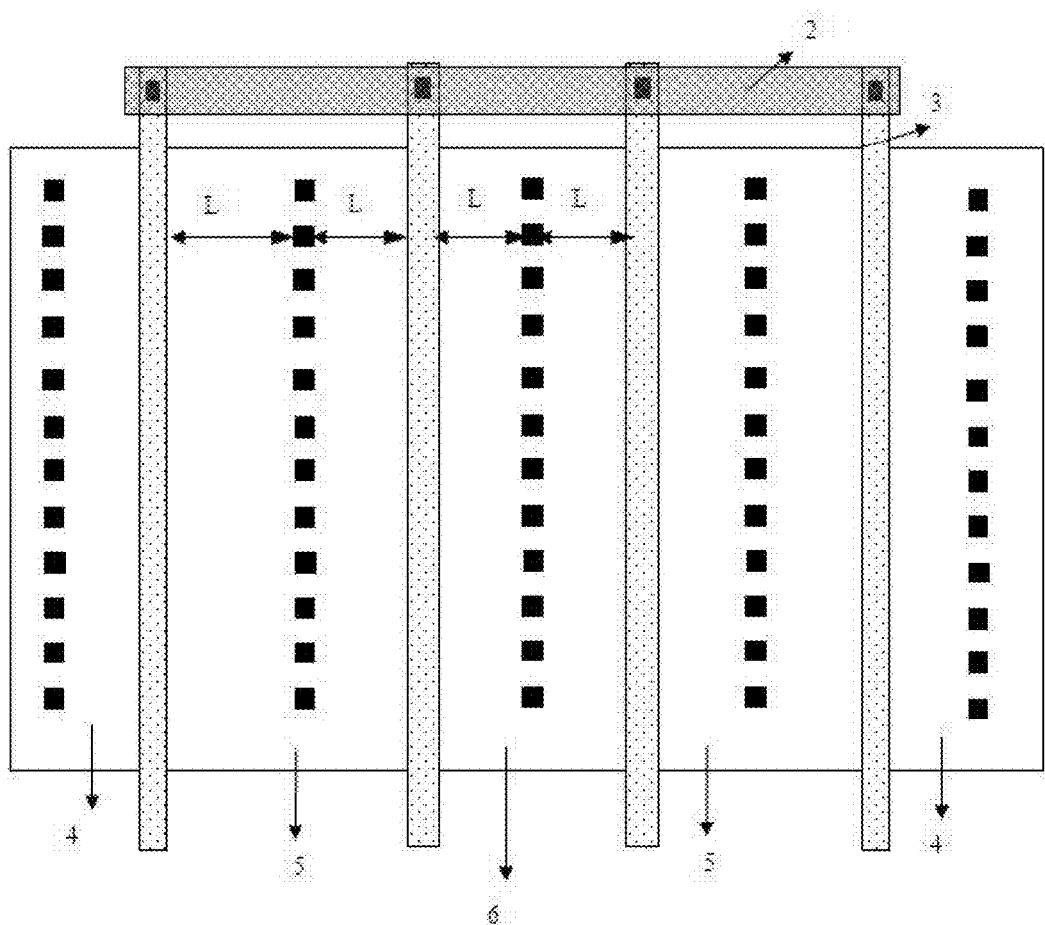
FIG. 1 is a schematic diagram of a traditional electrostatic protection structure.

1. Field oxide insulation
2. metal wire
3. polysilicon gate
4. outermost source region
5. N+ active region of drain region
6. N+ active region of source region
L. the distance from the polysilicon gate to the drain contact hole or source contact hole

DETAILED DESCRIPTION OF THE EMBODIMENTS

Figure 2:
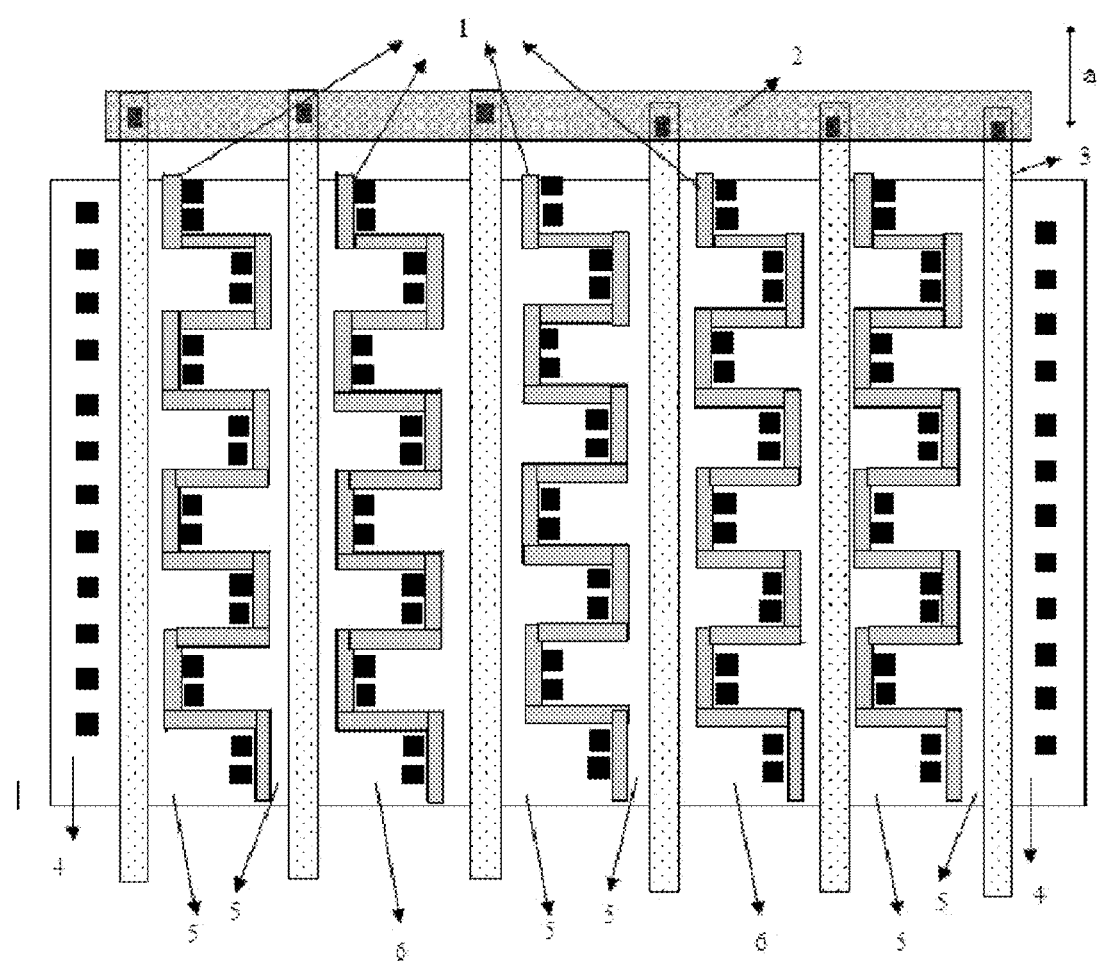
FIG. 2 is a schematic diagram of the electrostatic protective device of the present invention.
Figure 3:
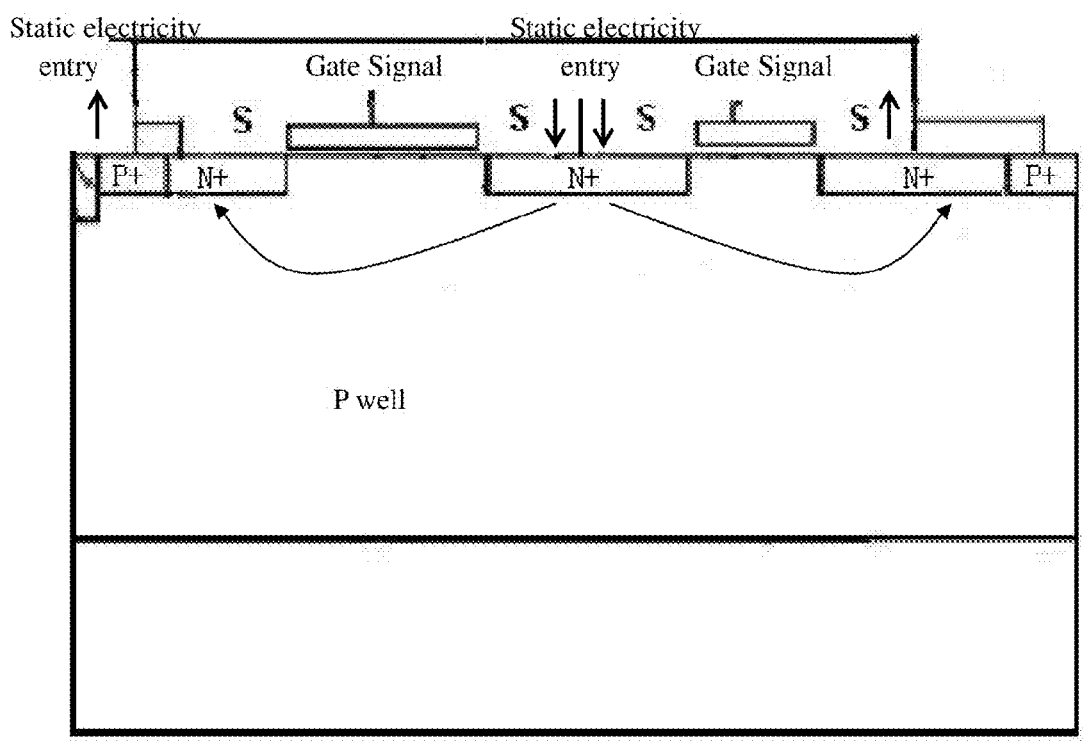
FIG. 3 is a sectional schematic diagram of an example of the electrostatic protective device of the present invention.

As shown in FIGS. 2 and 3, the electrostatic protective device of the present invention is described by taking an N-type MOS transistor as an example, with an axial direction a defined, comprising a CMOS transistor that is disposed entirely above a P-type silicon substrate and arranged into a multi-finger-like structure, on the outermost side on both sides of this electrostatic protective device being the source region of the MOS transistor, the contact hole of the outermost source reuion on both sides being in a straight line in the axial direction a; an active region of other drain region or source region in addition to the outermost source region on both sides is arranged in comb teeth pattern and in pairwise intersection, with the comb teeth of this example formed by interconnection of a plurality of concave or convex structures (but unlimited to being formed by interconnection of concave or convex structures, e.g. the pairwise intersected comb-tooth-pattern structure can also be formed by interconnection of a plurality of triangles or semicircles); between the active regions of the adjacent drain region or source region is a field oxide region isolation, and on the drain region or source region is disposed a contact hole connecting metal with the active region; the active region of the concave/convex drain region or source region enclosed by each of the field oxide region isolations is provided with two contact holes on a side of the field oxide region isolation far away from the polysilicon gate (but unlimited to two contact holes); the contact holes in the concave or convex structure of the adjacent MOS transistors in addition to those of the outermost source region on both sides are not disposed in the same straight line, a source contact hole of each of the MOS transistors being at a same distance from its respective polysilicon gate, a drain contact hole of each of the MOS transistors being at a same distance from its respective polysilicon gate.

Figure 4:
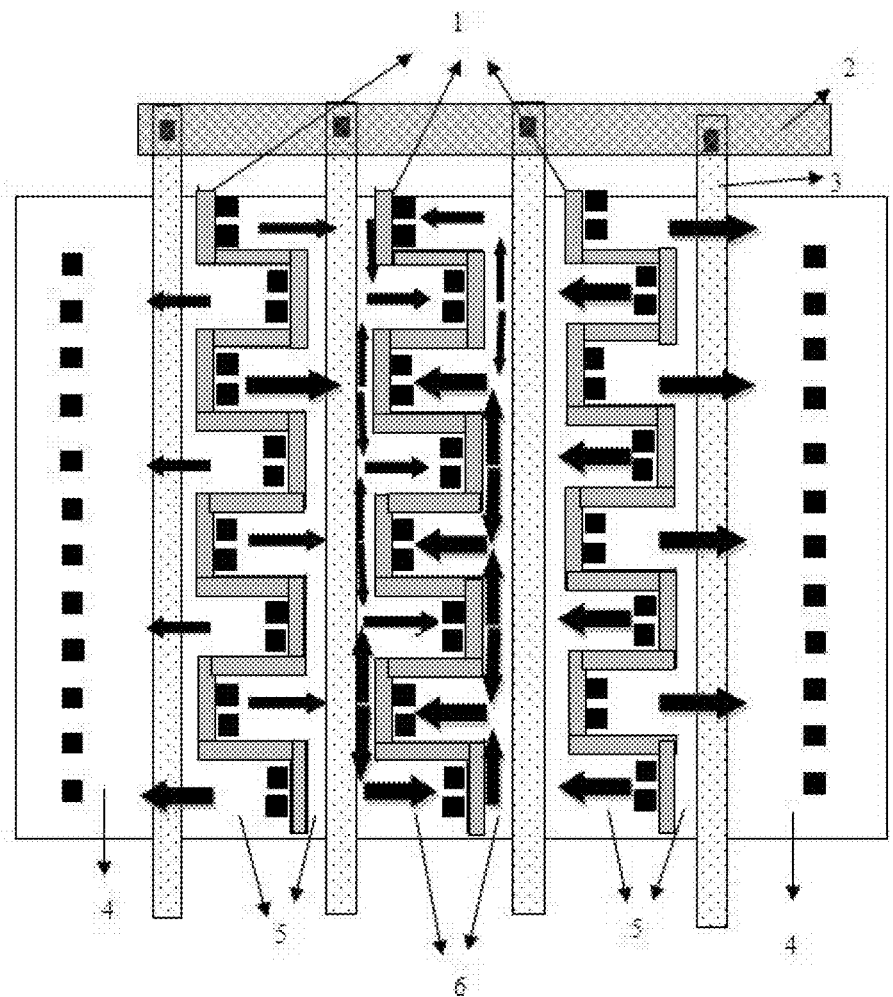
FIG. 4 is a schematic diagram of the current path of the electrostatic protective device of the present invention.
Figure 5:
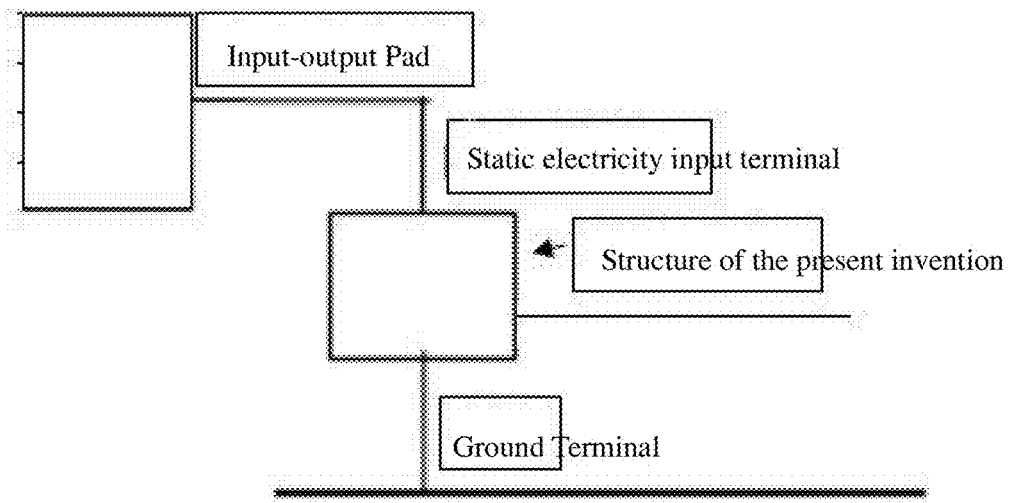
FIG. 5 is a schematic diagram of the application structure of the electrostatic protective device of the present invention.

The connection structure of the electrostatic protective device of the present invention applied to an electrostatic protection circuit is as shown in FIG. 5; when static electricity enters the electrostatic protective device of the present invention from the drain electrode, the current path through which it flows is as shown in FIG. 4, with the current flowing out of the metal contact hole of the source region through a channel; in the entire current path, the distance from the polysilicon gate to the drain contact hole and source contact hole is still kept to be L (being the same as in a traditional electrostatic protection structure), without reducing the distance L because of reduced area of the drain region and source region, which then guarantees constant electrostatic capability while the occupied area is reduced.

The present invention is described in detail through the above specific embodiment and example, which however do not restrict the present invention. Without departing from the principle of the present invention, those skilled in the art can also make many variations and improvements, which should also be considered to be within the scope of protection of the present invention.

What is claimed is:

1. An electrostatic protective device, comprising:
    A plurality of CMOS transistors disposed entirely above a P-type silicon substrate and arranged into a multi-finger-like structure;
    a pair of outermost source regions of the CMOS transistors are situated on the outermost sides of the electrostatic protective device;
    at least one drain region and at least one source region forming an active region are situated in-between the pair of outermost source regions;
    a field oxide region is situated in each of the at least one drain region and the at least one source region;
    a plurality of contact holes is disposed on the at least one drain region and the at least one source region connecting metal in the active region;
    wherein the at least one drain region is arranged in comb tooth pattern and in pairwise intersection;
    wherein the at least one source region is arranged in comb tooth pattern and in pairwise intersection;
    wherein the plurality of contact holes on the comb-tooth-pattern and pairwise intersected active region are located at a tip portion of the comb-tooth-pattern active region, whereby the contact hole is closer to a side of the field oxide region isolation than the polysilicon gate.

2. The electrostatic protective device according to claim 1, wherein the plurality of contact holes in the Usame CMOS transistor are not all disposed along a same straight line;
    wherein the plurality of source contact holes are located a same distance apart from its respective polysilicon gate, and
    wherein a drain contact hole of each of the MOS transistors being at a same distance apart from its respective polysilicon gate.

3. The electrostatic protective device according to claim 1, wherein the MOS transistor is of an N type.

4. The electrostatic protective device according to claim 1, wherein the MOS transistor is of a P type.

5. An electrostatic protective device including a plurality of CMOS transistors disposed above a P-type silicon substrate and arranged into a multi-finger-like structure, comprising:
    At least one drain region and at least one source region separated by a polysilicon gate;
    A pair of outermost source regions with a plurality of polysilicon gates surround the at least one drain region and the at least one source region;
    A first field oxide isolation in a square wave pattern comprising a plurality of drain peaks and a plurality of drain valleys is located in the at least one drain region;
    A second field oxide isolation in a square wave pattern comprising a plurality of source peaks and a plurality of source valleys is located in the at least one source region;
    A plurality of drain peak contact holes disposed along the plurality of drain peaks closer in distance to the first field oxide isolation than any polysilicon gate;
    A plurality of drain valley contact holes disposed along the plurality of drain valleys closer in distance to the first field oxide isolation than any polysilicon gate;
    A plurality of source peak contact holes disposed along the plurality of source peaks closer in distance to the second field oxide isolation than any polysilicon gate;
    A plurality of source valley contact holes disposed along the source valleys closer in distance to the second field oxide isolation than any polysilicon gate.

6. An electrostatic protective device, comprising:
    a plurality of CMOS transistors disposed above a P-type silicon substrate arranged into a multi-finger-like structure;
    a plurality of outermost source regions surrounds the electrostatic protective device;
    at least one drain region and at least one source region separated by a polysilicon gate are within the plurality of outermost source regions;
    a field oxide insulation in an oscillation pattern with peaks and valleys is disposed in each of the at least one drain region and the at least one source region;
    a first plurality of contact holes aligned adjacent the peaks each a distance L away from the polysilicon gate; and
    a second plurality of contact holes aligned adjacent the valleys each a distance L away from the polysilicon gate.

* * * * *